United States Patent [19]

Tran

[11] Patent Number: 4,661,930
[45] Date of Patent: Apr. 28, 1987

[54] HIGH SPEED TESTING OF INTEGRATED CIRCUIT

[75] Inventor: Bao G. Tran, Houston, Tex.
[73] Assignee: Texas Instruments Incorporated, Dallas, Tex.
[21] Appl. No.: 636,941
[22] Filed: Aug. 2, 1984
[51] Int. Cl.$^4$ .............................................. G11C 7/00
[52] U.S. Cl. .................................... 365/201; 377/28; 371/21
[58] Field of Search .......................... 365/201; 371/21; 377/28

[56] References Cited

U.S. PATENT DOCUMENTS

4,061,908 12/1977 de Jonge et al. .................... 365/201

Primary Examiner—Joseph A. Popek
Attorney, Agent, or Firm—John G. Graham

[57] ABSTRACT

A register of the type used on as address counter in a dynamic RAM is tested by a method which does not require cycling through every possible value of the register contents. The counter is first loaded with a fixed value, all 1's or all 0's, and the contents checked by an AND or OR gate, producing a one-bit output which is monitored off-chip. Then, the carry feedback path to the counter register is altered, as by inverting all but the LSB, and the contents again checked, using the one-bit output via the AND or OR. In this manner, the operation of the counter is tested in three cycles.

5 Claims, 8 Drawing Figures

HIGH SPEED TESTING OF INTEGRATED CIRCUIT

RELATED CASES

This application discloses subject matter also disclosed in copending applications Ser. No. 626,791, filed July 2, 1984; Ser. No. 630,507, filed July 11, 1984, Ser. No. 634,898, filed July 26, 1984; Ser. No. 634,901, filed July 26, 1984, now U.S. Pat. No. 4,618,947; Ser. No. 640,716, filed Aug. 14, 1984; and Ser. No. 640,717, filed Aug. 14, 1984; all assigned to Texas Instruments.

BACKGROUND OF THE INVENTION

This invention relates to semiconductor devices, and more particularly to circuits for rapid testing of registers and the like in dynamic memory devices.

Dynamic MOS read/write memory devices have been constructed generally as shown in U.S. Pat. No. 4,081,701 (a 16k dynamic RAM) issued to White, McAdams and Redwine, or U.S. Pat. No. 4,293,993 (a 64K dynamic RAM) issued to McAlexander, White and Rao, both assigned to Texas Instruments. When memory devices of this type are manufactured in higher densities, such as 256K and 1-Megabit and beyond, the problem of testing all of the cells and all of the other circuits on the chip becomes formidable.

Testing problems are increased when functions are added to the memory devices. For example, a self-refresh function as disclosed in U.S. Pat. No. 4,207,618, issued to White and Rao, assigned to Texas Instruments, requires a row address counter to be included on the chip. In a 1-Meg device, refreshed at 512 cycles per period, this means that a 9-bit counter is required; a 9-bit counter needs 512 cycles to be completely tested by conventional methods. Similarly, a counter used in a device having an extended nibble mode may require a lengthy test period.

It is the principal object of this invention to provide improved test circuitry for high density dynamic RAM devices, particularly for testing counter registers and the like. Another object is to provide testing circuitry for a CMOS dynamic RAM in which the testing time is minimized, and the circuitry added to the device is minimized. A further object is to provide high speed test circuitry for semiconductor devices which contain registers for counting and the like.

SUMMARY OF THE INVENTION

In accordance with one embodiment of the invention, a register of the type used as an address counter in a dynamic RAM is tested by a method which does not require cycling through every possible value of the register contents. The counter is first loaded with a fixed value, all 1's or all 0's, and the contents checked by an AND or OR gate, producing a one-bit output which is monitored off-chip. Then, the carry feedback path to the counter register is altered, as by inverting all but the LSB, and the contents again checked, using the one-bit output via the AND or OR. In this manner, the operation of the counter is tested in three cycles.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
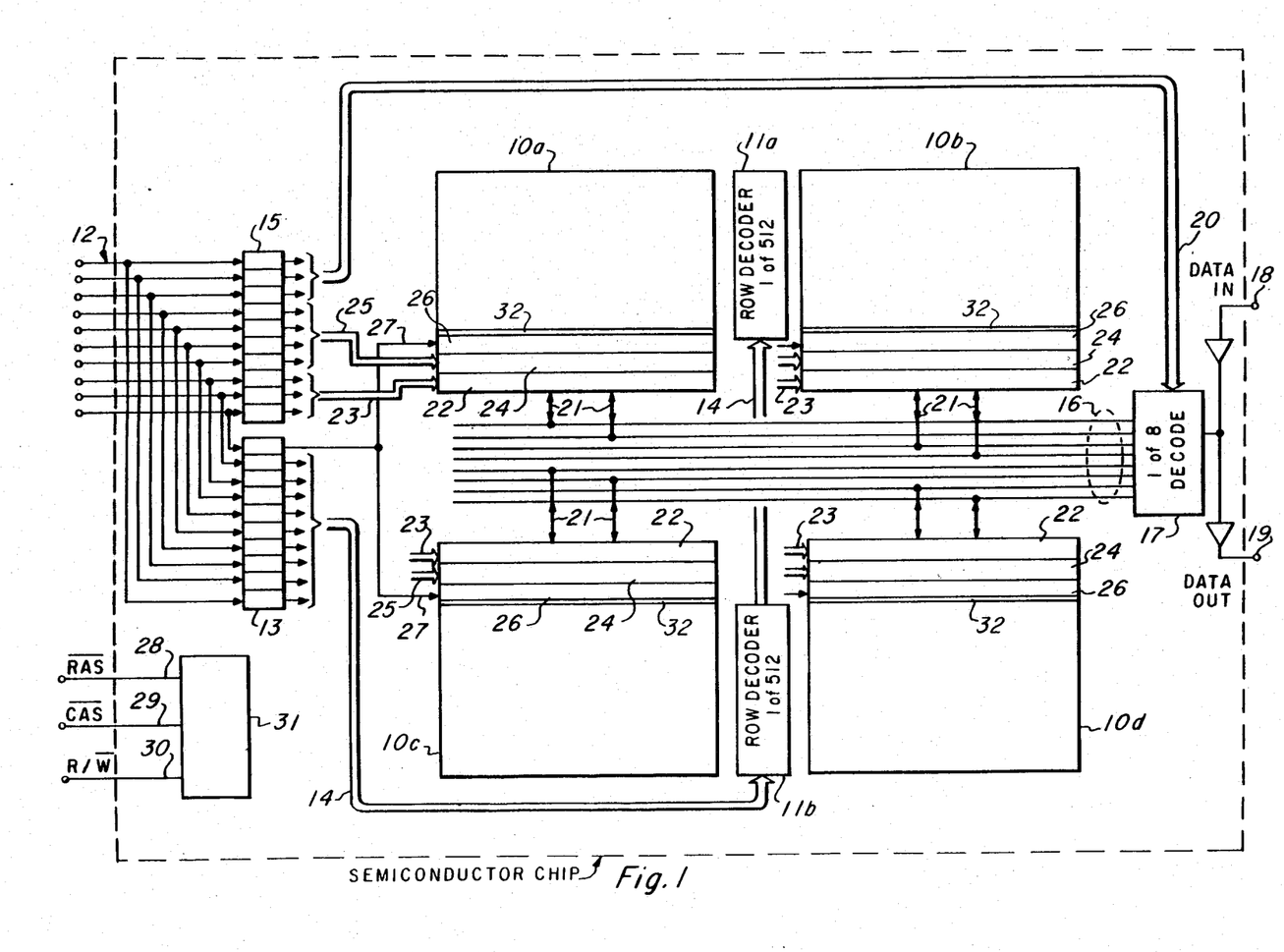
FIG. 1 is an electrical diagram in block form of a dynamic memory device of the 1-Megabit size which may use the counter testing circuitry of the invention.

Referring to FIG. 1, a block diagram of one example of a semiconductor read/write memory chip is illustrated which may use test circuitry constructed according to the invention. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 (or internally from a refresh counter) and lines 14. The row address latches include a refresh counter which is tested according to the invention, as will be explained. A 10-bit column address is also applied to the input pins 12, in time-multiplexed manner, and this column address is coupled to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I//O lines 21. A 2-of-16 column selection is made in sixteen intermediate output buffers 22 for each block, using three bits of the column address on lines 23 from buffers 15. A 1-of-16 column selection is made in each of sixteen sets of sixteen intermediate output buffers 24 in each block 10a–10d, using four bits of the column address on lines 25 from buffers 15. Each one of 512 sense amplifiers 26 in each block is connected to one of the columns in the array (each column is made up of two column line halves or "bit lines"). Each buffer 24 is coupled to one of two columns; this selection is based on one bit of the row address from buffers 13 on line 27.

Figure 1A:
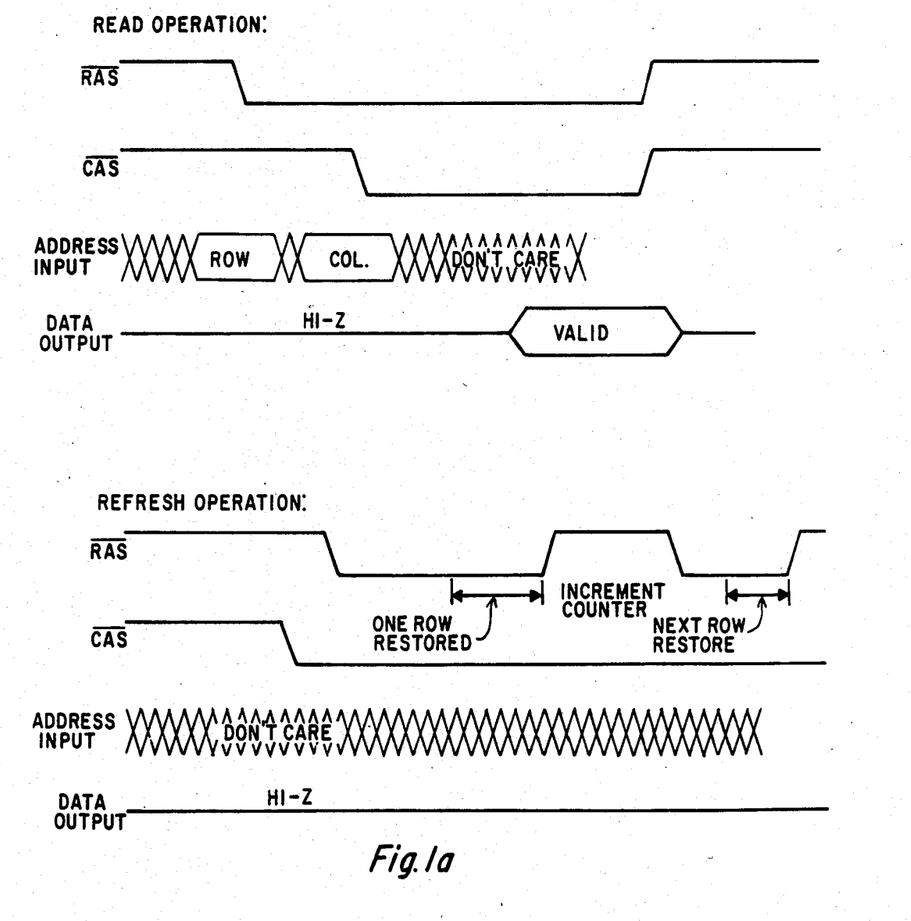
FIG. 1(a) is a timing chart explaining the read and refresh operations of the circuit shown in FIG. 1.

The memory device receives a row address strobe $\overline{RAS}$ on input pin 28, and a column address strobe $\overline{CAS}$ on input pin 29. Selection of a read or a write operation is made by a R/$\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 1a, and a one-bit data read (or write) occurs. To initiate a refresh mode, however, the CAS voltage drops before RAS, and no address is gated into the chip, but instead a local address register within the address buffers 13 is used. According to the invention, this address counter in buffer 13 is set up for a special test mode so the entire count sequence need not be employed in the manufacturer's test before shipment.

Each block of the array contains two rows of dummy cells 32 in the usual manner, as discussed in the above-mentioned U.S. Pat. Nos. 4,239,993 or 4,081,701.

Figure 2:
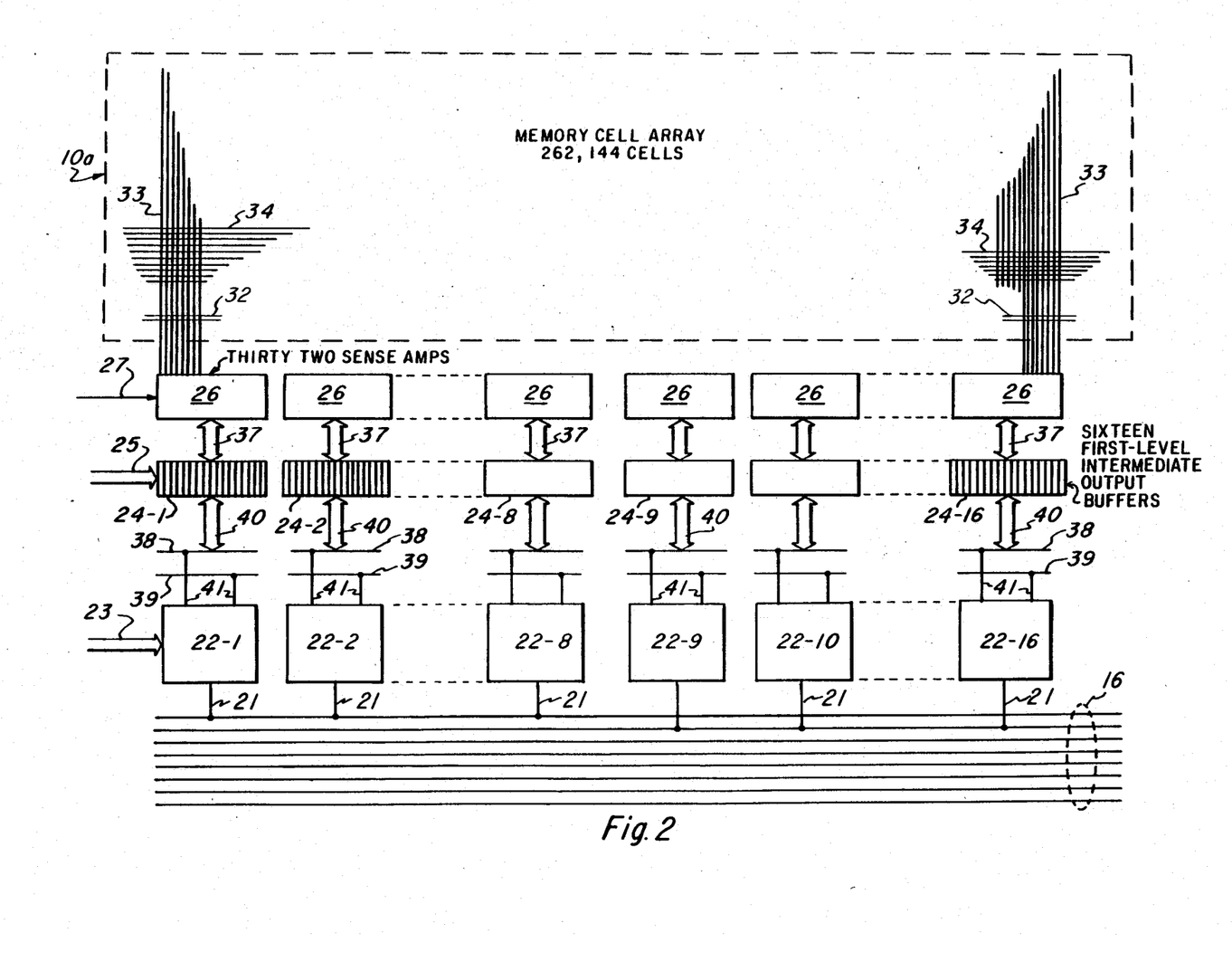
FIG. 2 is an electrical diagram in block form of a part of the memory device of FIG. 1.

Referring to FIG. 2, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the sixteen buffers 22-1 . . . 22-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, or two column line halves). Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double-rail at the lines 38 and 39 to single rail at the data I/O lines 16, for a write operation.

Figure 3:
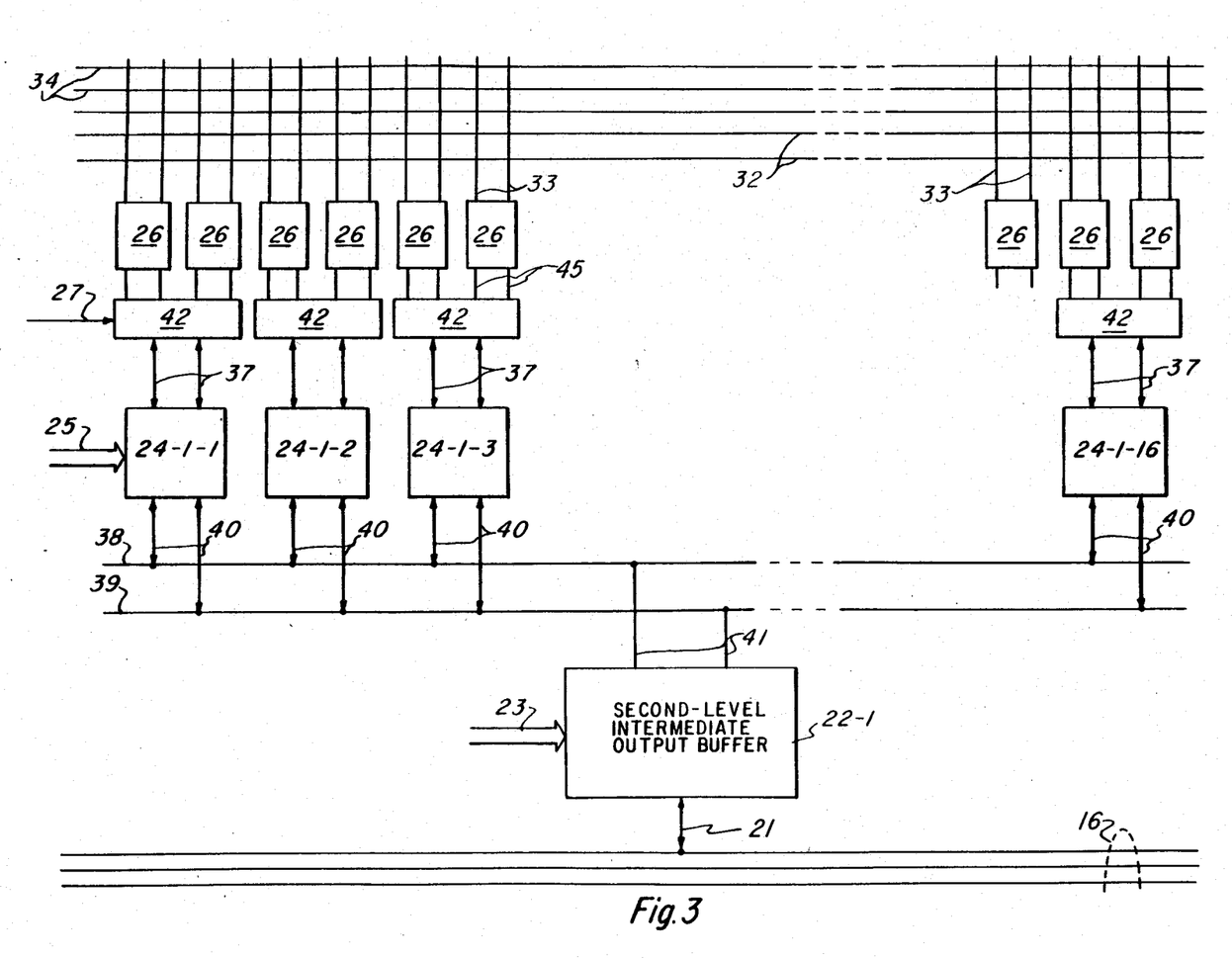
FIG. 3 is an electrical diagram in block form of a part of the circuitry of FIG. 2.

Referring to FIG. 3, a part of the circuitry of FIG. 2 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from it, in the so-called folded bit line configuration. Thus, both dummy rows 32 are on the same side of the sense amp. The row lines 34 intersect the bit lines, and memory cells are at intersections of row lines and bit lines. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operative to couple a read-or-write bit of data to or from the lines 38, 39 by lines 40. The buffer 22-1 of FIG. 3 may or may not be selected by the 2-of-16 select provided by three bits on lines 23, for coupling the dual-rail I/O lines 38, 39 to the single rail I/O line 16 for this group.

Figure 4:
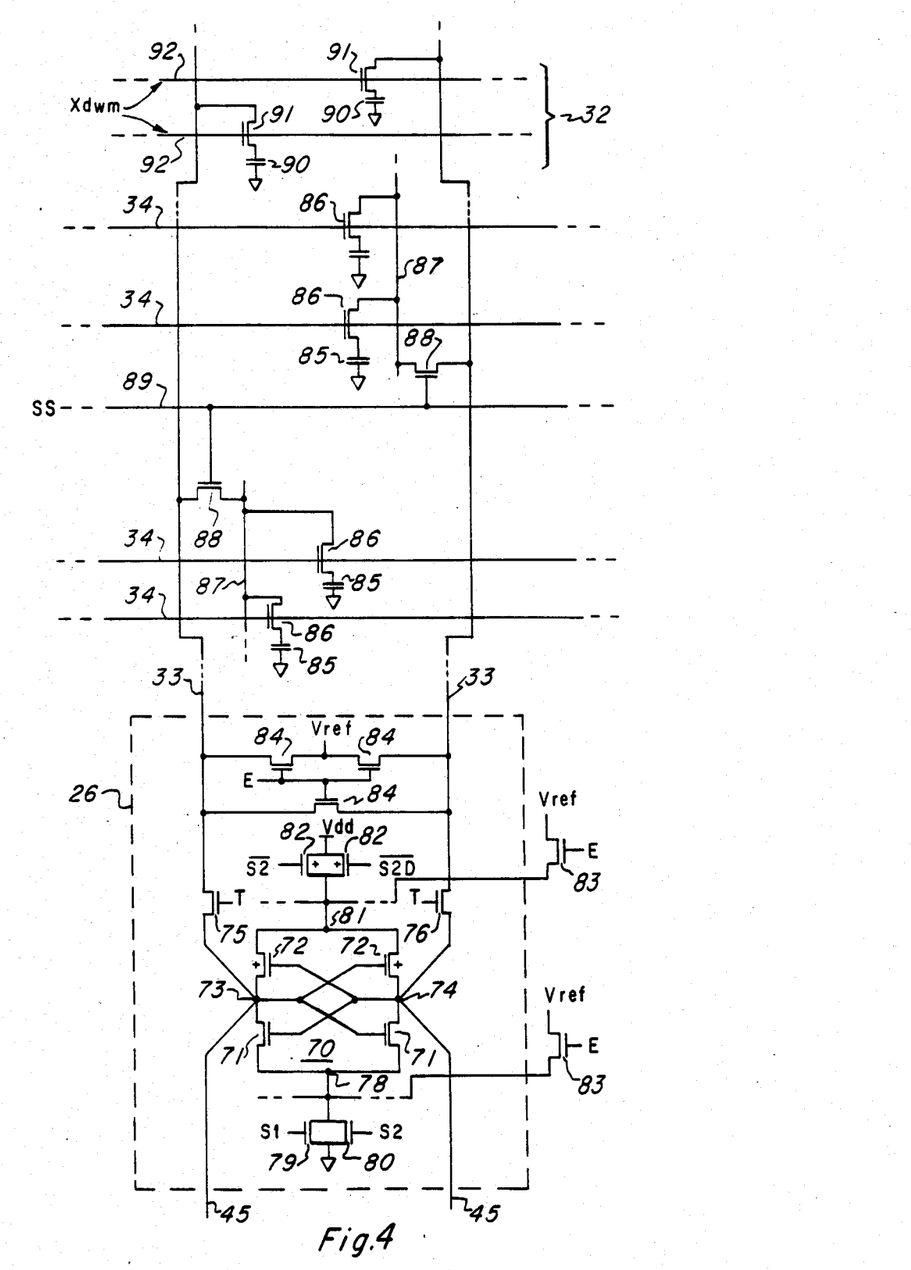
FIG. 4 is an electrical diagram in schematic form of the sense amplifier and cell array of FIGS. 1-3.

Referring to FIG. 4, one of the sense amplifiers 26 is shown in detail. This figure also shows the two bit lines 33 for this sense amplifier and four of the 512 row lines 34 perpendicular to these bit lines. The sense amplifier employs a CMOS cross-coupled flip-flop 70 having N-channel driver transistors 71 and P-channel transistors 72. Sense nodes 73 and 74 are connected to bit lines 33 through the source-drain paths of isolating transistors 75 and 76, as explained in copending application Ser. Nos. 636,938 or 636,939, filed August, 1984, by Charvaka Duvvury and Adin Hyslop, assigned to Texas Instruments. A node 78 on the ground side of the flip-flop 70 is coupled to ground through two N-channel transistors 79 and 80, which have sense clocks S1 and S2 on their gates. The transistor 79 is much smaller than the transistor 80, and clock S1 occurs first, so the initial sensing is at a lower-gain condition, and is performed by N-channel transistors 71. On the Vdd side, a node 81 is coupled to the supply through P-channel transistors 82, one of which has sense clock $\overline{S2}$ on its gate and the other a delayed $\overline{S2D}$ on its gate. The sense clock $\overline{S2}$ is the complement of S2, so the P-channel transistors 72 start to operate only after the second clock S2 is activated. There is a two-interval sense operation, first S1, then S2 and $\overline{S2}$. The transistor pairs 79,80 and the transistors 82, are shared with all of the other sense amplifiers 26 in two blocks 10a and 10b, i.e., 1024 sense amplifiers. The node 78 is precharged to about one-half Vdd by a transistor 83 when E is high.

The bit lines 33 are precharged and equalized through three transistors 84 which have an equalize clock voltage E on their gates; two of these transistors 84 have their sources connected to a reference voltage Vref. The value of this reference voltage is about half Vdd, so little or no net charge is needed from the chip supply Vdd to precharge all of the bit lines. That is, one line 33 will be high and the other low for each sense amplifier, so one will charge the other, and Vref need only supply any differential that might have occurred. The clock E is generated in the control circuitry 31 after the end of an actve cycle, when $\overline{RAS}$ goes high.

Each of the memory cells consists of a capacitor 85 and an access transistor 86, with the gates of all of the 512 access transistors 86 in a row being connected to a row line 34. Only one row line 34 of 512 in the block is turned on at any one time, so only one memory cell capacitor 85 is connected to a bit line 33 for a given sense amplifier 26. According to the invention of application Ser. No. 634,898, filed July 26, 1984 by David J. McElroy, assigned to Texas Instruments, in order to reduce the ratio of the bit line capacitance to the value of the storage capacitance 85, a number of bit line segments 87 are employed for each pair of bit lines 33. One of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier (16×32=512). Half of the segments are connected to one bit line and half to the other. The row decoder 11a or 11b selects the appropriate one of sixteen lines 89 by a segment select voltage SS, at the same time as this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors 90 and access transistors 91. When the selected storage cell is on the lefthand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 5:
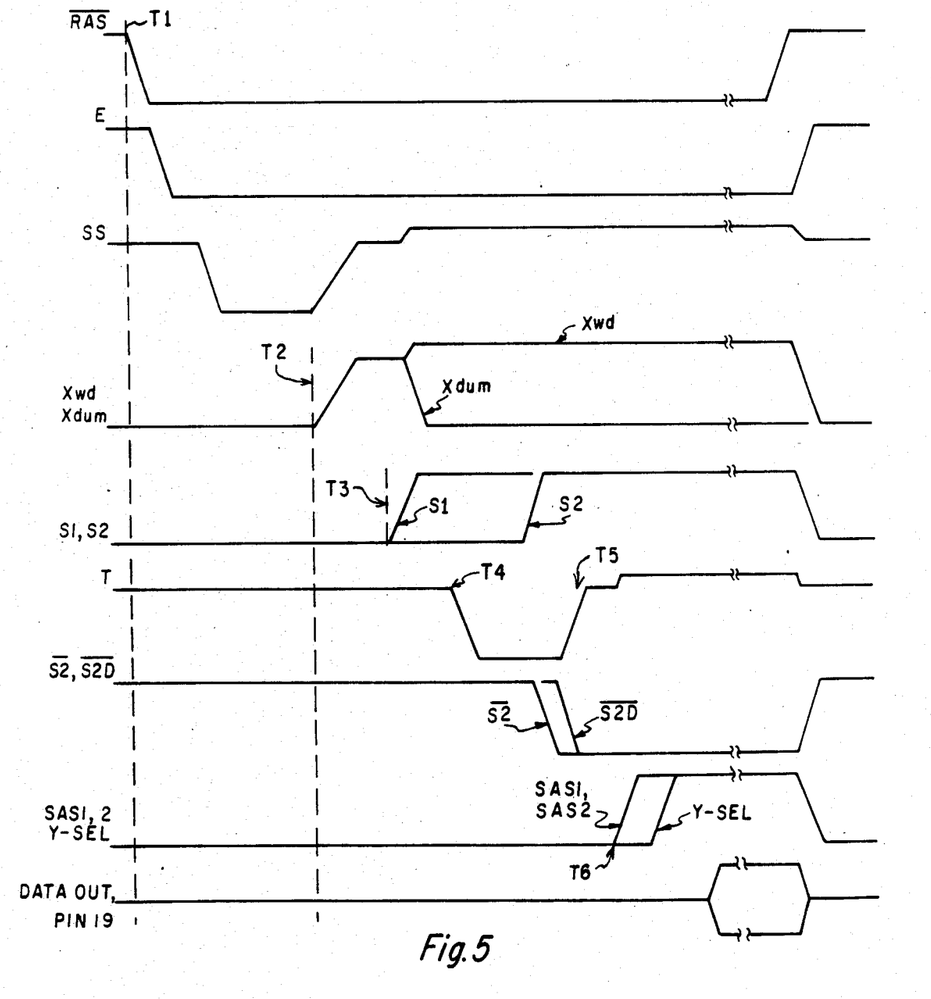
FIG. 5 is a timing diagram showing voltage vs. time for various nodes in the circuit of FIGS. 1-4.

Referring to FIG. 5, the sequence of operation of the memory device will be explained for a single-bit read operation. An active cycle begins with the $\overline{RAS}$ voltage dropping from +5 to zero at the time T0. This example is a read cycle, so at time T0 the $R/\overline{W}$ input voltage is at +5. The time prior to T0 is a precharge cycle, during which the equalize voltage E has been high, so all of the bit lines 33 and the nodes 78, have been precharged to the Vref voltage, assumed to be about ½ Vdd or +2.5. The segment select signal SS on all lines 89 is also held high during the precharge cycle, so all of the segments 87 are also precharged to the Vref voltage. The dropping of $\overline{RAS}$ at T0 causes the equalize voltage E to drop, isolating the pairs of bit lines 33 from each other and from Vref. The segment select signal SS then drops, isolating all of the segments 87 from the bit lines 33. As soon as the row decoders 11a, 11b. have had time to respond to the row address, at time T1 the Xwd and Xdum voltages start to rise on the selected 1-of-512 row line 34 and selected 1-of-2 dummy line 92; at the same time T1, the segment-select signal SS on one of the lines 89 is brought up. These address voltages Xwd, Xdum and SS are brought up rather slowly, and after reaching the Vdd level, SS and Xwd are boosted above Vdd to eliminate the Vt drop across the access transistors 86 and 88. The Xdum voltage falls, since the function of the dummy cells is completed during initial sensing, and the dummy capacitors can be decoupled from the bit lines so these capacitors can be precharged, as disclosed in copending application Ser. No. 630,507, filed July 11, 1984 by Tran, McAdams and Childers, assigned to Texas Instruments. At time T2, the sense amplifiers 26 are first activated by the S1 voltage going high, turning on the high-impedance N-channel transistor 79; this begins to separate the bit lines 33 further than the separation caused by the differential voltages on the storage cell and dummy cell. But before any current flows from the supply Vdd through transistors 72, the T voltage falls at T3, isolating the bit lines 33 from the sense nodes 73 and 74. After the T voltage falls, the sense voltage S2 is brought up, so the large transistor 80 begins to conduct; also $\overline{S2}$ drops, so one P-channel load transistor 82 begins to conduct. After a slight delay $\overline{S2D}$ falls, and the other P-channel transistor 82 begins to conduct. After S2 rises and $\overline{S2}$ drops at T4, the T voltage is brought up to Vdd. At time T5 after the isolating transistors 75, 76 have been turned back on, sensing is complete and one bit line 33 is high and the other at zero, so the sense-amp-select voltage SAS1 or SAS2 (selected by address bit 27) is turned on, connecting one of the bit lines to a buffer 24 via lines 37 of FIG. 3, using the multiplexer 42. Just after this the Y-select outputs from column decoders are valid, so the selected data bit becomes valid on the line 16, and shortly thereafter the data bit is valid on the output pin 19.

For a refresh operation, the function is exactly the same as described for a read operation, except there is no Y output. The SAS1, SAS2 and Y-sel signals do not occur, and the data output stays at a high impedance level.

Figure 6:
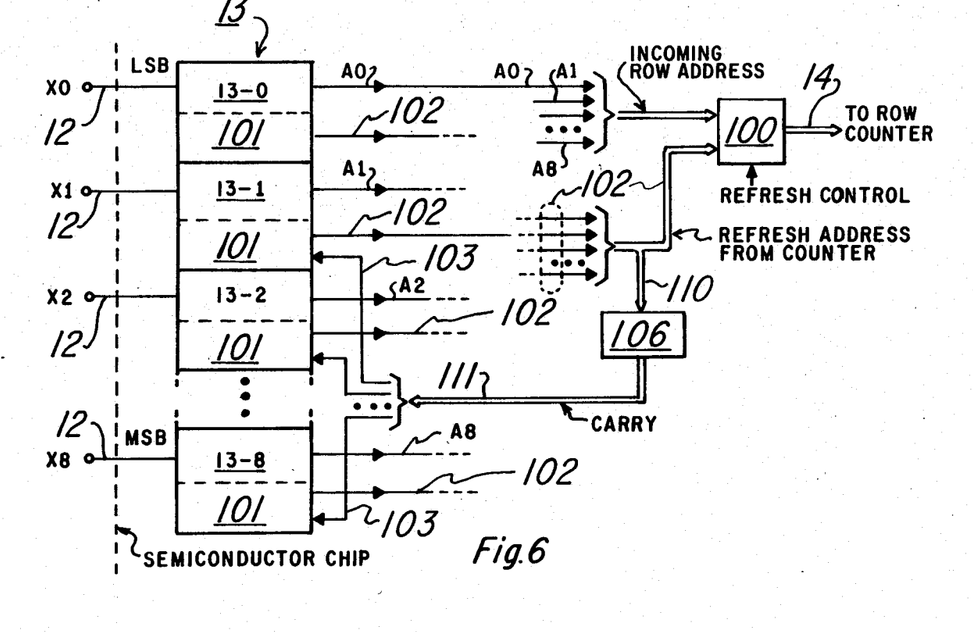
FIG. 6 is an electrical diagram in block form of the row address buffers with refresh counter in the device of FIG. 1 which may be tested according to the invention.
Figure 7:
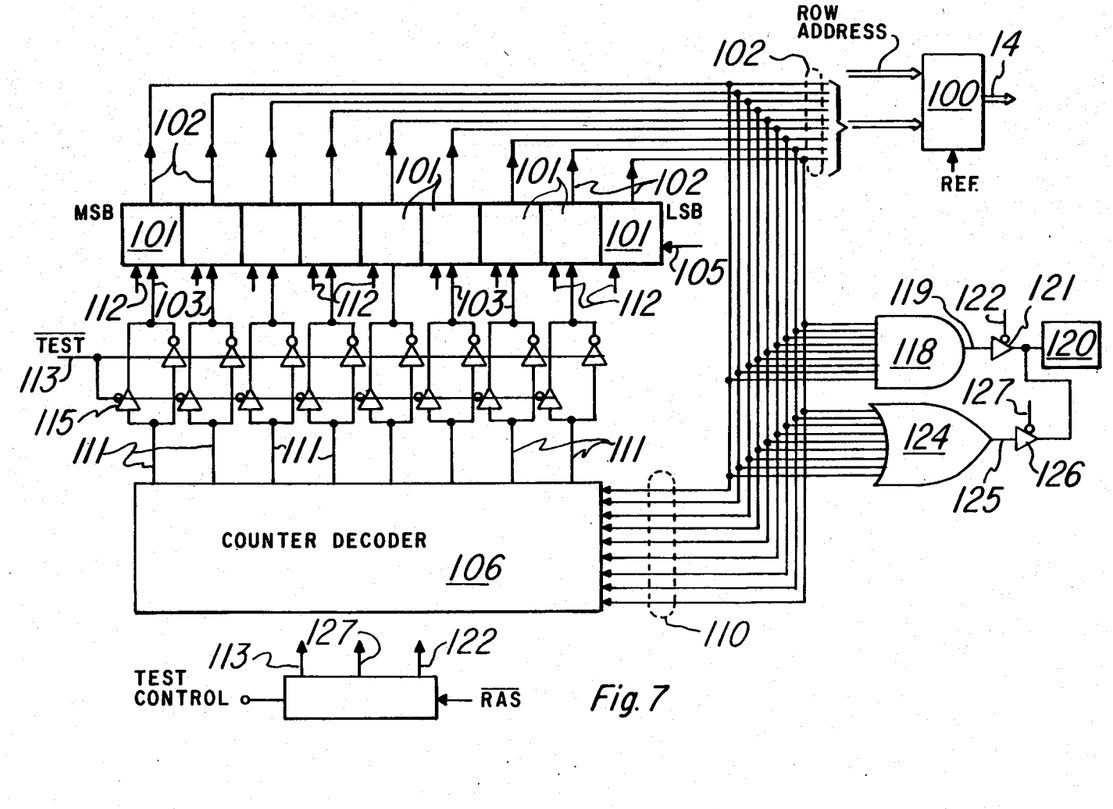
FIG. 7 is a more detailed electrical diagram of the refresh address counter of FIG. 6, including the test function, according to the invention.

With reference to FIGS. 6 and 7, according to the invention, the 9-bit row address counter is constructed within the address buffers 13 to allow testing of the counter itself without merely stepping through the entire count of 512 cycles. A multiplexer 100 selects either the incoming row address or internal counter, depending upon the sequence of $\overline{RAS}$ and $\overline{CAS}$. The counter consists of, in this case, nine counter stages 101 of conventional form, connected as a binary counter by feedback from the counter stage outputs 102 to input 103 by decoder circuit 106. In ordinary operation the counter is incremented by a refresh control RF input 105 which would be generated in the circuitry 31 when $\overline{CAS}$ falls before $\overline{RAS}$, signalling a refresh-only cycle using an internal row address. The input 105 toggles the LSB of the counter stages 101, and each successively higher stage is toggled or not as determined by the decoder 106, so a binary count of 0-to-511 is implemented as 512 RF pulses are applied in succession to the input 105. The nine bit output on the lines 102 is applied to the input of the decoder 106 by lines 110, and the outputs 111 of the decoder are applied to the inputs 103 of the counter stages 101.

In order to provide a rapid test capability, each of the counter stages 101 also has in input 112, so the counter may be loaded in parallel with all 1's. These inputs correspond to a "set" input of a flip-flop. In addition, a Test input on a line 113 functions to select either an inverting or a non-inverting path 114 or 115 between the each decoder output 111 and the counter stage input 103, except for the LSB. This can reverse the normal function of the feedback through the inverter.

The counter output on lines 102 and 110 is applied to the nine inputs of an AND logic gate 118, so if all of the outputs 102 are 1's an output 119 from this gate is high, and an output pad 120 will be driven high if a buffer 121 is turned on by a control 122. In like manner, all of the outputs 102 and 110 are applied to the nine inputs of an OR gate 124, which produces a "0" output 125 if all of the lines 102 are low; this output 125 drives the pad 120 by buffer 126 if a control 127 is on. The pad 120 usually would be the data output terminal 19, or it may be another of the terminals; the buffers 121 and 126 are activated only in the test condition and will not interfere with normal use of the pad in standard read/write operations.

The purpose of the test circuitry is first to check that each of the counter register stages can flip from a 0 state to a 1 state, and back from a 1 to a 0, and second to check that the counter decoder 106 correctly determines the carry bits. The test operation begins with loading the counter 101 with all 1's by the inputs 112, and at this point, using a standard LSI I/C test machine, the condition is detected at the pad 120 due to the action of the AND gate 118; thus, in the cycle that the inputs 112 load 1's to the counter, the control 122 goes high to produce an output through the buffers 121. In the next cycle the Test control on the line 113 goes to an active low condition, the LSB is toggled, and all of the bits of the register 101 will flip to 0. The OR gate 124 produces an output on pad 120 through the buffer 126 because the controls 122 and 127 are flipped, and this monitors a 0 on the outputs 102 of the counter, due to the standard operation of the carry through the decoder 106, implementing a binary count. The next step is to again toggle the Test voltage on line 113, which should cause the counter to go from 0 to 1 for all bits; because the carry feedback to all bits except LSB is inverted; the test controls 122 and 127 are reversed so the AND gate 118 allows the all-1 condition to be monitored on the pad

120. Thus, in three cycles, the performance of all bits of the register in flipping from 1-to-0 and 0-to-1, and feedback through the decoder 106, is checked.

The test mode of operation is established by a special input condition which would not occur in normal operation. The test mode is entered only in the manufacturing test procedures. For example, while the slice is at a multiprobe station, before being broken into individual chips, a test pad may be activated by an electrical probe; this would not be one of the boding pads used for input or output of addresses, data or controls in normal operation. Also, an over-voltage condition on one of the terminals used in normal operation may be used to trip a test control circuit when at the test station. A test control circuit as seen in FIG. 7 detects this condition and generates the controls 113, 122 and 127 in successive $\overline{RAS}$ cycles.

When this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor memory device comprising:
   an array of rows and columns of storage cells, each storage cell having a storage capacitor which decays with time,
   addressing means for activating one of said rows of storage cells,
   an address input to said device, said address input including terminals of the device,
   an address counter having a plurality of bits and an internal carry circuit,
   multiplex means to apply an address either from said address input of the device or from said address counter to said addressing means,
   and testing means for testing the operation of said counter without counting through all combinations of said bits, including:
      logic circuit means to detect the bits in said counter and to produce a 1-bit output at a terminal of said device indicating either all 1's or all 0's in said counter,
      and means coupled to said internal carry circuit for altering said carry circuit in response to a control input.

2. A device according to claim 1 wherein said means for altering includes means for inverting at least some of an output of said carry circuit.

3. A device according to claim 1 wherein said logic circuit means includes an AND gate and an OR gate.

4. A device according to claim 3 wherein said AND gate is operated in one cycle and said OR gate in another cycle.

5. A device according to claim 4 including means for loading a fixed value into said counter in response to a test signal.

* * * * *